United States Patent
Ji et al.

(10) Patent No.: US 9,520,206 B2
(45) Date of Patent: Dec. 13, 2016

(54) ANISOTROPIC CONDUCTIVE FILM AND METHOD FOR MANUFACTURING THE SAME

(71) Applicant: SAMSUNG ELECTRO-MECHANICS CO., LTD., Suwon-Si (KR)

(72) Inventors: Soo Young Ji, Suwon-Si (KR); Jung Hyun Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 332 days.

(21) Appl. No.: 14/263,673

(22) Filed: Apr. 28, 2014

(65) Prior Publication Data

US 2015/0187456 A1    Jul. 2, 2015

(30) Foreign Application Priority Data

Dec. 30, 2013  (KR) ................. 10-2013-0167575

(51) Int. Cl.
| | |
|---|---|
| *H01B 1/24* | (2006.01) |
| *H05K 3/32* | (2006.01) |
| *H05K 3/36* | (2006.01) |
| *G02F 1/1345* | (2006.01) |

(52) U.S. Cl.
CPC ............. *H01B 1/24* (2013.01); *H05K 3/323* (2013.01); *H05K 3/365* (2013.01); *G02F 1/13452* (2013.01); *H05K 2201/0245* (2013.01); *H05K 2201/0323* (2013.01)

(58) Field of Classification Search
CPC .. H01B 1/24; H05K 3/323; H05K 2201/0323; H05K 2201/0245; G02F 1/13452
See application file for complete search history.

(56) References Cited

U.S. PATENT DOCUMENTS

| | | | | |
|---|---|---|---|---|
| 4,568,592 A | * | 2/1986 | Kawaguchi | C08K 7/02 252/511 |
| 2010/0247892 A1 | * | 9/2010 | Lee | H01B 1/24 428/221 |
| 2011/0027491 A1 | * | 2/2011 | Rueckes | B82Y 10/00 427/458 |
| 2011/0163275 A1 | * | 7/2011 | Simmons | C08G 59/5033 252/511 |

FOREIGN PATENT DOCUMENTS

JP    2010-073681    4/2010

\* cited by examiner

*Primary Examiner* — Eisa Elhilo
(74) *Attorney, Agent, or Firm* — NSIP Law

(57) ABSTRACT

Disclosed herein are an anisotropic conductive film and a method for manufacturing the same. The anisotropic conductive film according to the present invention includes: an insulating resin; and a plurality of conductive graphenes dispersed into the insulating resin.

15 Claims, 3 Drawing Sheets

ANISOTROPIC CONDUCTIVE FILM AND METHOD FOR MANUFACTURING THE SAME

CROSS REFERENCE TO RELATED APPLICATION

This application claims the benefit of Korean Patent Application No. 10-2013-0167575, filed on Dec. 30, 2013, entitled "Anisotropic Conductive Film and Method for Manufacturing the Same", which is hereby incorporated by reference in its entirety into this application.

BACKGROUND OF THE INVENTION

1. Technical Field

The present invention relates to an anisotropic conductive film and a method for manufacturing the same.

2. Description of the Related Art

An electronic packaging technology, which is a technology of manufacturing extensive and various systems including every step from a semiconductor device to a final product, is important for determining performance, size, cost, reliability, and the like, of the final electronic products.

In a liquid crystal display (LCD) package, conductive adhesives are used for mechanical and electrical connection between a printed circuit board and a transparent electrode, and among them, an anisotropic conductive film (ACF) is particularly used.

The conductive adhesive is largely classified into an anisotropic conductive film, an isotropic conductive adhesive (ICA), or the like, and basically has a form in which electrically conductive particles such as nickel (Ni) or nickel (Ni)/polymer, silver (Ag), and the like, are dispersed into a thermosetting or thermoplastic insulating resin.

The isotropic conductive film consists of electrically conductive particles and an insulating resin, wherein as the electrically conductive particle functioning an electrical conduction, powder typed or fibrous carbon-based materials were initially used, then, a solder ball was used, and a polymer ball having nickel particles or nickel coated on a surface thereof is nowadays used.

PRIOR ART DOCUMENT

Patent Document

Patent Document 1 Japanese Patent Laid-Open Publication No. JP 2010-073681

SUMMARY OF THE INVENTION

The present invention has been made in an effort to provide an anisotropic conductive film having significantly excellent electrical conductivity, and a method for manufacturing the same.

In addition, the present invention has been made in an effort to provide an anisotropic conductive film cheaply and easily manufactured, and having excellent elasticity, and a method for manufacturing the same.

According to a preferred embodiment of the present invention, there is provided an anisotropic conductive film including: an insulating resin; and a plurality of conductive graphenes dispersed into the insulating resin.

The graphene may have a structure consisting of graphitized carbons having bidirectionality.

The graphene may have a two-dimensional planar structures.

The graphenes may be aligned in a vertical direction.

The conductive film may have an insulating property in a horizontal direction.

The conductive film may have an electrical conductivity in a vertical direction.

The insulating resin may be at least one selected from a liquid crystal polymer (LCP) resin, an epoxy resin, and a resin containing liquid crystal polymer and epoxy.

The insulating resin may be semi-cured (B-stage) so that flow of the graphenes is fixed.

According to another preferred embodiment of the present invention, there is provided a method for manufacturing an anisotropic conductive film, the method including: preparing conductive graphenes; dispersing the graphenes into an insulating resin; and orienting the graphenes in a vertical direction by performing a molding process.

The graphene may have a structure consisting of graphitized carbons having bidirectionality.

The graphene may have a two-dimensional planar structure.

The conductive film may have an insulating property in a horizontal direction.

The conductive film may have an electrical conductivity in a vertical direction.

The insulating resin may be at least one selected from a liquid crystal polymer (LCP) resin, an epoxy resin, and a resin containing liquid crystal polymer and epoxy.

The orienting of the graphenes may be performed by the molding process using a magnetic field or an electric field.

The method may further include, after the orienting of the graphenes, semi-curing the insulating resin so that flow of the graphenes dispersed into the insulating resin is fixed.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
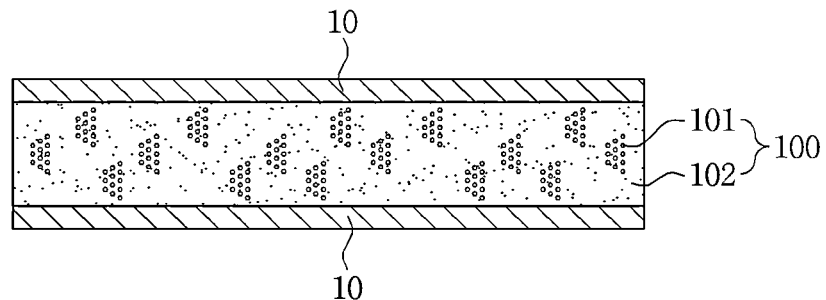
FIG. 1 is a cross-sectional view schematically showing an anisotropic conductive film according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Anisotropic Conductive Film

FIG. 1 is a cross-sectional view schematically showing an anisotropic conductive film 100 according to a preferred embodiment of the present invention.

Referring to FIG. 1, the anisotropic conductive film 100 according to the preferred embodiment of the present invention includes an insulating resin 102; and a plurality of conductive graphenes 101 dispersed into the insulating resin 102.

The anisotropic conductive film 100 has an insulating property in a horizontal direction and has an electrical conductivity in a vertical direction.

The anisotropic conductive film 100 having an electrical conductivity in a vertical direction may be manufactured by stirring and dispersing graphenes 101 having high electrical conductivity into the insulating resin 102 in a non-cured state, performing a molding process using an electric field or a magnetic field to orient the graphenes 101 having bidirectionality in a vertical direction, wherein the insulating resin 102 is semi-cured so that flow of the graphenes 101 is fixed.

Here, a protective film 10 protecting upper and lower surfaces of the anisotropic conductive film 100, which is a cover film generally protecting a film, protects and moves the anisotropic conductive film 100.

Therefore, at the time of using the anisotropic conductive film 100, the anisotropic conductive film 100 is selectively and only used while being separated from the protective film 10.

The reason that the graphenes 101 dispersed into the insulating resin 102 are oriented by the molding process using the electric field or the magnetic field is because the graphenes 101 having two-dimensional planar structure are oriented in a vertical direction to have an electric conduction between upper and lower portions of the film.

Figure 2:
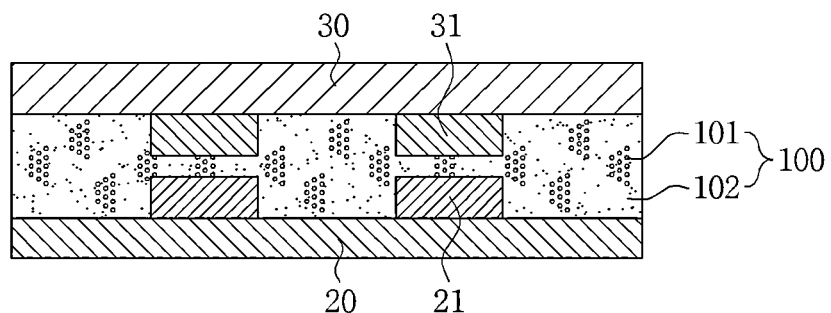
FIG. 2 is a cross-sectional view schematically showing an application of the anisotropic conductive film according to a preferred embodiment of the present invention.

FIG. 2 is a cross-sectional view schematically showing an application of the anisotropic conductive film 100 according to a preferred embodiment of the present invention.

Referring to FIG. 2, the anisotropic conductive film 100 is interposed between a substrate 20 having a circuit layer 21 and a semiconductor device 30 having a bump pad 31.

Here, the substrate 20, which is a copper clad layer having a base member in a film shape containing a resin material and patterns formed on both surfaces thereof, may be made of a material referred to as copper clad lamination (CCL), wherein as the resin material which is a base member, a thermosetting resin such as epoxy resin, a thermoplastic resin such as polyimide, polyethylene terephthalate (PET), a resin having a reinforcement material such as a glass fiber or an inorganic filler impregnated therein, for example, prepreg, may be used. In addition, a thermosetting resin and/or a photocurable resin, and the like, may be used, but the present invention is not particularly limited thereto.

The substrate 20 is a copper clad layer having patterns formed both surfaces thereof, which may be referred to as a connection pad and/or a circuit layer.

The connection pad and/or the circuit layer is not limited but may be applied as long as it is made of a conductive metal, and copper is typically used.

In the drawings, other detailed components of the semiconductor device 30 was omitted and schematically shown. However, it may be easily appreciated by those skilled in the art that all semiconductor devices 30 known in the art are not particularly limited but may be applied to the present invention.

Here, the resin has an insulating property, the film has an insulating property in a horizontal direction, and the vertically oriented conductive graphenes 101 electrically interconnect the substrate 20 having the circuit layer 21 and the semiconductor device 30 having the bump pad 31.

Here, the graphene 101 has significantly excellent electrical conductivity and physical properties, such that the anisotropic conductive film 100 may be applied to variously designed semiconductor packages.

The insulating resin 102 may be at least one selected from a liquid crystal polymer (LCP) resin, an epoxy resin, and a resin containing liquid crystal polymer and epoxy.

Here, the epoxy resin may be contained in 0.01 to 50 parts by weight based on 100 parts by weight of the liquid crystal polymer. In addition, as the epoxy resin to be used, a bisphenol A type epoxy resin, a naphthalene-modified epoxy resin, a cresol novolac type epoxy resin, a rubber-modified epoxy resin, and the like, may be used, but the present invention is not particularly limited thereto.

Figure 3:
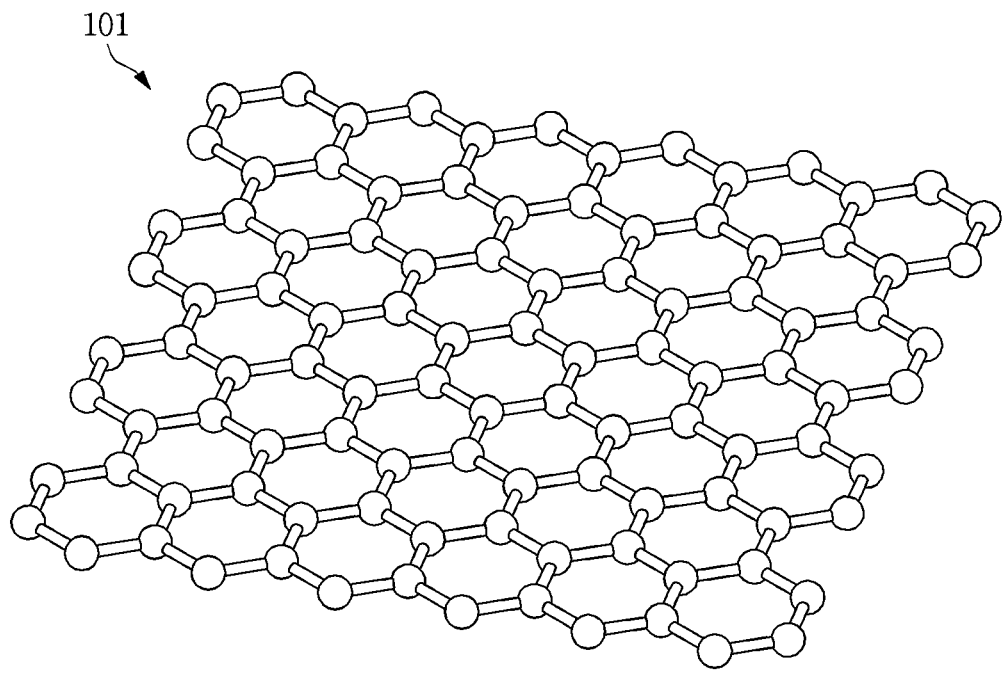
FIG. 3 is a cross-sectional view schematically showing a graphene shape of the anisotropic conductive film according to a preferred embodiment of the present invention.

Referring to FIG. 3, the graphene 101 may be prepared by oxidizing and reducing graphite.

In general, the graphite has a layered structure in which graphenes 101 are stacked, wherein the graphene has a planar structure in which carbon atoms are connected by hexagonal rings and a distance between the layers is 3.35 Å.

The graphene 101 has a graphitized carbon structure having bidirectionality.

That is, the structure is a two-dimensional planar structure in which carbon nanotubes are unfolded as a planar state, has high electrical conductivity corresponding to carbon nanotube and excellent mechanical physical properties.

A general method for preparing the graphene 101 from the graphite is largely classified into a mechanical exfoliation method and a physicochemical exfoliation method.

The mechanical exfoliation method, which applies a widely used adhesive tape, and the like, to generally used graphite, is a scheme of repeatedly attaching and detaching the adhesive tape on a graphite agglomeration to break the stacked structure consisting of the graphite.

The physicochemical exfoliation method includes generating an oxidation reaction between a surface of the graphite and an interlayer structure in a state in which the graphite agglomeration having the stacked structure is dispersed into an appropriate solvent to thereby widen space between the layers and then surface-adsorbing other materials thereon to thereby perform a complete exfoliation in the end.

A surface or ends of the graphene 101, or both of surface and ends thereof are modified with ionic functional groups such as a carboxylic group, a hydroxyl group, a sulfonyl group, an amine group, and the like.

In order to modify the graphene 101 so as to have a carboxylic group and a hydroxyl group, all methods generally used in the art may be used.

As an example of the modification method, there is a method for pulverizing, oxidizing graphite to prepare oxidized graphite, followed by ultrasonification to disperse the oxidized graphite, thereby obtaining oxidized graphenes 101, and then followed by treatment with hydrazine and ammonia to reduce the oxidized graphenes on the surface thereof, thereby obtaining graphenes 101.

Or, the graphites are added to sulfuric acid ($H_2SO_4$) to weaken Van der waals force between layers and are oxidized by potassium permanganate ($KMnO_4$) and hydrogen peroxide ($H_2O_2$), the graphites are separated for each layer by ultrasonication to prepare graphene 101 oxide, and then using ammonia and hydrazine, the graphene 101 oxide is reduced to prepare graphenes 101.

Here, a degree in which the reduction reaction proceeds on a surface of the graphene 101 by a mass ratio between hydrazine and ammonia to be used may be adjusted, and therefore, a concentration of surface ions of the graphene 101 is adjusted to control electric charge amount.

In the case in which the reduction reaction largely proceeds on the surface of the graphenes 101, the concentration of ions is deteriorated to weaken ionic bonding strength with polymer particulates but increase electrical conductivity, and in contrast, in the case in which the reduction reaction insufficiently proceeds, the concentration of ions is increased to increase ionic bonding strength with polymer particulates but largely deteriorate electrical conductivity.

In addition thereto, the graphenes 101 may be prepared by various methods.

Examples of preparing the graphenes may include a method for using nanotube cutting by function of multi-wall carbon nanotube in a solvent containing potassium permanganate and sulfuric acid, a method for performing chemical vapor deposition (CVD) process using methane as a carbon source on a nickel or copper material, a method for performing a chemical vapor deposition (CVD) process using methane as a carbon source on silicon carbide material, and the like, but the present invention is not particularly limited thereto.

The anisotropic conductive film 100 according to the preferred embodiment of the present invention and the method for manufacturing the same may provide excellent conductivity and utility by using conductive particles having significantly excellent strength, elasticity, and electric conductivity.

Method for Manufacturing Anisotropic Conductive Film

Figure 4:
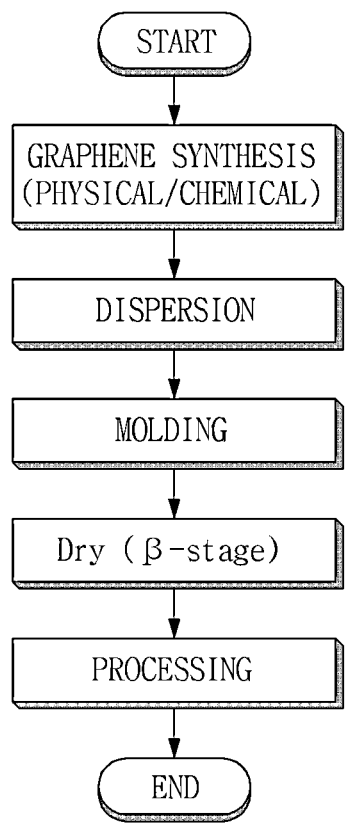
FIG. 4 is a flow chart schematically showing a method for manufacturing the anisotropic conductive film according to the preferred embodiment of the present invention.

FIG. 4 is a flow chart schematically showing a method for manufacturing the anisotropic conductive film 100 according to a preferred embodiment of the present invention.

First, conductive graphene 101 is prepared.

The graphene 101 may be prepared by oxidizing and reducing graphite.

In general, the graphite has a layered structure in which graphenes 101 are stacked, wherein the graphene has a planar structure in which carbon atoms are connected by hexagonal rings and a distance between the layers is 3.35 Å.

The graphene 101 has a graphitized carbon structure having bidirectionality.

That is, the structure is a two-dimensional planar structure in which carbon nanotubes are unfolded as a planar state, has high electrical conductivity corresponding to carbon nanotube and excellent mechanical physical properties.

A general method for preparing the graphene 101 from the graphite is largely classified into a mechanical exfoliation method and a physicochemical exfoliation method.

The mechanical exfoliation method, which applies a widely used adhesive tape, and the like, to generally used graphite, is a scheme of attaching and detaching the adhesive tape on a graphite agglomeration to break the stacked structure consisting of the graphite.

The physicochemical exfoliation method includes generating an oxidation reaction between a surface of the graphite and an interlayer structure in a state in which the graphite agglomeration having the stacked structure is dispersed into an appropriate solvent to thereby widen space between the layers and then surface-adsorbing other materials thereon to thereby perform a complete exfoliation in the end.

A surface or ends of the graphene 101, or both of surface and ends thereof are modified with ionic functional groups such as a carboxylic group, a hydroxyl group, a sulfonyl group, an amine group, and the like.

In order to modify the graphene 101 so as to have a carboxylic group and a hydroxyl group, all methods generally used in the art may be used.

As an example of the modification method, there is a method for pulverizing, oxidizing graphite to prepare oxidized graphite, followed by ultrasonification to disperse the oxidized graphite, thereby obtaining oxidized graphenes 101, and then followed by treatment with hydrazine and ammonia to reduce the oxidized graphenes on the surface thereof, thereby obtaining graphenes 101.

Alternatively, the graphites are added to sulfuric acid ($H_2SO_4$) to weaken Van der waals force between layers and are oxidized by potassium permanganate ($KMnO_4$) and hydrogen peroxide ($H_2O_2$), the graphites are separated for each layer by ultrasonication to prepare graphene 101 oxide, and then using ammonia and hydrazine, the graphene 101 oxide is reduced to prepare graphenes 101.

Here, a degree in which the reduction reaction proceeds on a surface of the graphene 101 by a mass ratio between hydrazine and ammonia to be used may be adjusted, and therefore, a concentration of surface ions of the graphene 101 is adjusted to control electric charge amount.

In the case in which the reduction reaction largely proceeds on the surface of the graphenes 101, the concentration of ions is deteriorated to weaken ionic bonding strength with polymer particulates but increase electrical conductivity, and in contrast, in the case in which the reduction reaction insufficiently proceeds, the concentration of ions is increased to increase ionic bonding strength with polymer particulates but largely deteriorate electrical conductivity.

In addition thereto, the graphenes 101 may be prepared by various methods.

Examples of preparing the graphenes may include a method for using nanotube cutting by function of multi-wall carbon nanotube in a solvent containing potassium permanganate and sulfuric acid, a method for performing chemical vapor deposition (CVD) process using methane as a carbon source on a nickel or copper material, a method for performing a chemical vapor deposition (CVD) process using methane as a carbon source on silicon carbide material, and the like, but the present invention is not particularly limited thereto.

Then, the graphenes 101 are dispersed into the insulating resin 102.

The insulating resin 102 may be at least one selected from a liquid crystal polymer (LCP) resin, an epoxy resin, and a resin containing liquid crystal polymer and epoxy.

Here, the epoxy resin may be contained in 0.01 to 50 parts by weight based on 100 parts by weight of the liquid crystal polymer. In addition, as the epoxy resin to be used, a bisphenol A type epoxy resin, a naphthalene-modified epoxy resin, a cresol novolac type epoxy resin, a rubber-modified epoxy resin, and the like, may be used, but the present invention is not particularly limited thereto.

The graphenes 101 having high electrical conductivity are stirred and dispersed into the insulating resin 102 in a non-cured state.

Figure 5:
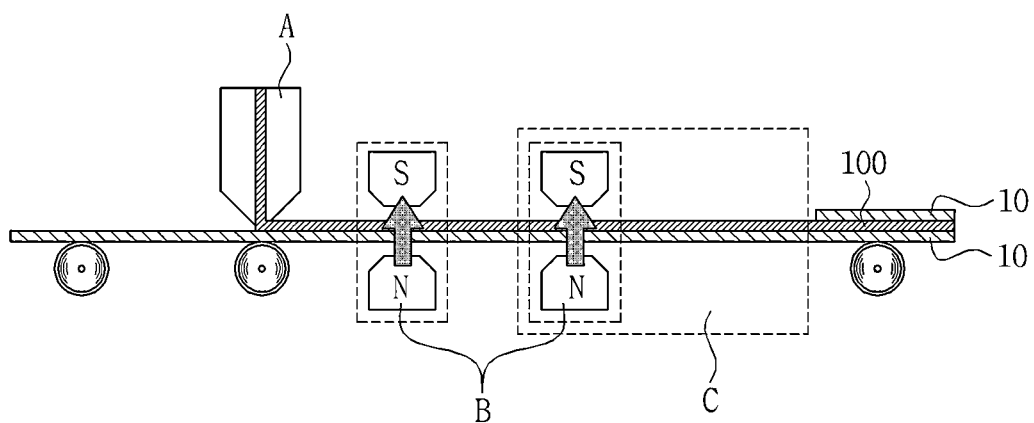
FIG. 5 is a cross-sectional view schematically showing a portion of the process for manufacturing the anisotropic conductive film according to a preferred embodiment of the present invention.

FIG. 5 is a cross-sectional view schematically showing a portion of the process for manufacturing the anisotropic conductive film 100 according to a preferred embodiment of the present invention.

Referring to FIG. 5, processes for injecting, molding, and drying the insulating resin 102 having the graphenes 101 stirred therein in a device may be confirmed.

First, the injection process A is a process for discharging the insulating resin 102 having the stirred graphenes 101 therein through an inlet.

Then, in the molding process B, the graphenes 101 are oriented in a vertical direction.

Figure 6:
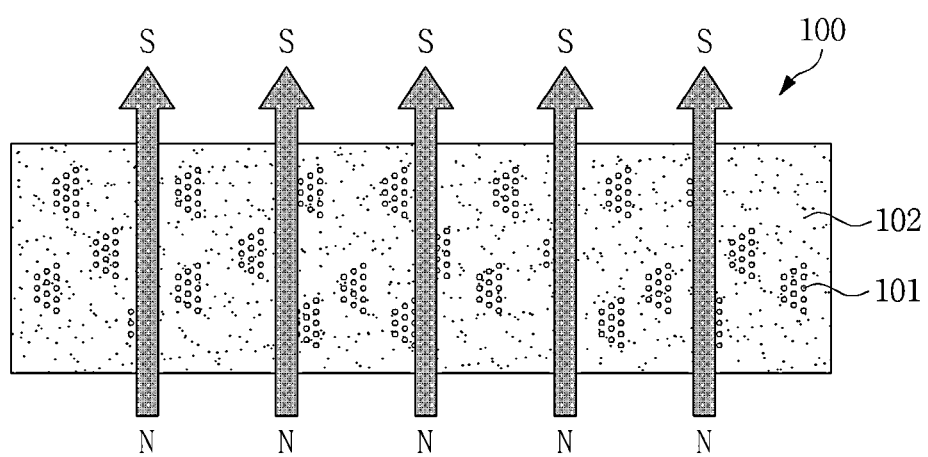
FIG. 6 is an enlarged perspective view of part B (molding process) of FIG. 5.

Here, it may be appreciated from FIG. 6 that in the case in which an upper surface on an electric field is disposed as a positive (+) pole and a lower surface thereon is disposed as a negative (−) pole, or an upper surface on a magnetic field is disposed as S pole and a lower surface thereon is disposed as N pole in order to orient the graphenes in a vertical direction, the graphenes 101 are oriented so as to be erected in a vertical direction. In addition, even in a case in which an upper surface on an electric field is disposed as a negative (−) pole and a lower surface thereon is disposed as a positive (+) pole, or an upper surface on a magnetic field is disposed as N pole and a lower surface thereon is disposed as S pole, the graphenes 101 may also be oriented so as to be erected in a vertical direction.

Through the molding process B as described above, the graphenes 101 having two-dimensional planar structure are erected in a vertical direction, thereby having an electrical connection between upper and lower portions of the film.

Through the process, the graphene 101 particles dispersed into the insulating resin 102 are interposed between conductive materials of upper and lower surfaces, to thereby serve as an anisotropic conductive film (ACF) conducting an electrical connection, and therefore, a film having significantly excellent electric conductivity and strength against bending may be provided.

Then, in the drying process (C), the film is dried so that the insulating resin 102 fixes the graphene 101, and the film treated by the process may be maintained in a semi-cured (B-stage) state.

After the drying process is completed, cover films protect upper and lower surfaces of the anisotropic conductive film 100.

Here, the protective film 10 protecting upper and lower surfaces of the anisotropic conductive film 100, which is a cover film generally protecting a film, protects and moves the anisotropic conductive film 100.

Therefore, at the time of using the anisotropic conductive film 100, the anisotropic conductive film 100 is selectively and only used while being separated from the protective film 10.

The anisotropic conductive film 100 according to the preferred embodiments of the present invention and the method for manufacturing the same may provide excellent conductivity and utility by using conductive particles having significantly excellent strength, elasticity, and electrical conductivity.

In addition, since the cost of the conductive particle is low and the manufacturing method thereof including dispersion and molding processes is simple, the cost for manufacturing the anisotropic conductive film may be reduced.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. An anisotropic conductive film comprising:
   an insulating resin; and
   a plurality of conductive graphenes dispersed into the insulating resin,
   wherein the graphenes are oriented in a vertical direction of upper and lower surfaces of the anisotropic conductive film.

2. The anisotropic conductive film as set forth in claim 1, wherein the graphene has a structure consisting of graphitized carbons having bidirectionality.

3. The anisotropic conductive film as set forth in claim 1, wherein the graphene has a two-dimensional planar structure.

4. The anisotropic conductive film as set forth in claim 1, wherein the conductive film has an insulating property in a horizontal direction.

5. The anisotropic conductive film as set forth in claim 1, wherein the conductive film has an electrical conductivity in a vertical direction.

6. The anisotropic conductive film as set forth in claim 1, wherein the insulating resin is at least one selected from a liquid crystal polymer (LCP) resin, an epoxy resin, and a resin containing liquid crystal polymer and epoxy.

7. The anisotropic conductive film as set forth in claim 1, wherein the insulating resin is semi-cured (B-stage) so that flow of the graphenes is fixed.

8. A method for manufacturing an anisotropic conductive film, the method comprising:
   preparing conductive graphenes;
   dispersing the graphenes into an insulating resin; and
   orienting the graphenes in a vertical direction by performing a molding process.

9. The method as set forth in claim 8, wherein the graphene has a structure consisting of graphitized carbons having bidirectionality.

10. The method as set forth in claim 8, wherein the graphene has a two-dimensional planar structure.

11. The method as set forth in claim 8, wherein the conductive film has an insulating property in a horizontal direction.

12. The method as set forth in claim 8, wherein the conductive film has an electrical conductivity in a vertical direction.

13. The method as set forth in claim 8, wherein the insulating resin is at least one selected from a liquid crystal polymer (LCP) resin, an epoxy resin, and a resin containing liquid crystal polymer and epoxy.

14. The method as set forth in claim 8, wherein the orienting of the graphenes is performed by the molding process using a magnetic field or an electric field.

15. The method as set forth in claim 8, further comprising, after the orienting of the graphenes, semi-curing the insulating resin so that flow of the graphenes dispersed into the insulating resin is fixed.

* * * * *